(12) United States Patent
Ford et al.

(10) Patent No.: US 6,756,236 B2
(45) Date of Patent: Jun. 29, 2004

(54) METHOD OF PRODUCING A FERROELECTRIC MEMORY AND A MEMORY DEVICE

(75) Inventors: William Ford, Stuttgart (DE); Jurina Wessels, Fellbach (DE); Tobias Vossmeyer, Fellbach (DE); Hidemi Tomita, Tokyo (JP)

(73) Assignee: Sony International (Europe) GmbH, Berlin (DE)

( * ) Notice: Subject to any disclaimer, the term of this patent is extended or adjusted under 35 U.S.C. 154(b) by 0 days.

(21) Appl. No.: 10/006,347

(22) Filed: Dec. 4, 2001

(65) Prior Publication Data

US 2002/0066915 A1 Jun. 6, 2002

(30) Foreign Application Priority Data

Dec. 5, 2000 (EP) .............................. 00126732

(51) Int. Cl.$^7$ ................................ H01L 21/00
(52) U.S. Cl. .................... 438/3; 438/287; 438/785
(58) Field of Search .......................... 438/3, 216, 240, 438/287, 785

(56) References Cited

U.S. PATENT DOCUMENTS

| | | | |
|---|---|---|---|
| 3,890,604 A | | 6/1975 | Schroder |
| 5,083,855 A | * | 1/1992 | Clark et al. ............ 349/196 |
| 5,164,852 A | * | 11/1992 | Konuma ................ 349/126 |
| 5,239,504 A | * | 8/1993 | Brady et al. ............ 365/157 |
| 5,777,977 A | | 7/1998 | Fujiwara et al. |
| 6,025,618 A | | 2/2000 | Chen |
| 6,297,865 B1 | * | 10/2001 | Matsui et al. ............ 349/123 |
| 6,498,744 B2 | * | 12/2002 | Gudesen et al. ......... 365/145 |
| 6,628,016 B2 | * | 9/2003 | Michl et al. ............ 310/10 |

FOREIGN PATENT DOCUMENTS

EP 0 837 504 4/1998

* cited by examiner

*Primary Examiner*—Amir Zarabian
*Assistant Examiner*—Jamie L. Brophy
(74) *Attorney, Agent, or Firm*—Frommer Lawrence & Haug LLP; William S. Frommer

(57) ABSTRACT

The present invention refers to a method of producing a ferroelectric memory which method comprises:
 a) providing ferroelectric particles,
 b) providing a substrate,
 c) orientating at least a subset of said ferroelectric particles such that there is an axis of said particles along which axis a dipole moment may be directed in the ferroelectric state, said axis having an orientation the average of which is in at least one predetermined direction with regard to a surface of said substrate,
 d) allowing said ferroelectric particles to attach to said substrate,
and to a method of storing information on a substrate, and to a memory device.

40 Claims, 6 Drawing Sheets

METHOD OF PRODUCING A FERROELECTRIC MEMORY AND A MEMORY DEVICE

The present invention refers to a method of producing a ferroelectric memory, a method of storing information on a substrate and to a memory device.

The storage of information is becoming increasingly important with the advent of larger datasets. Computer programs and algorithms have become more complex and larger, and therefore the demand for an optimization of storage space has grown, aiming at a miniaturization of the individual unit in which the information is to be stored. Conventional storage methods rely for example on optically or magnetically readable/writeable media which, however, have certain limitations with respect to the minimum size possible.

Electronic computers have grown more powerful as their basic sub-unit, the transistor, has shrunk during the past forty years. However, limitations imposed by quantum mechanics and fabrication techniques are likely to inhibit further reduction in the minimum size of today's bulk-effect semiconductor transistors. It is projected that conventional devices may not function well as the overall size of the semiconductor transistor is aggressively miniaturized to below approximately 0.1 micrometers (100 nm). In order to continue the miniaturization of the circuit elements down to the nanometer scale, perhaps even to the molecular scale, researchers are investigating several alternatives to the transistor. These new nanometer-scale electronic (nanoelectronic) devices perform both as switches and amplifiers just like today's transistors. However, unlike today's transistors, which operate based on the movement of masses of electrons in bulk matter, the new devices take advantage of quantum mechanical phenomena that emerge on the nanometer scale, including the discreteness of electrons.

A group of materials that have been found to be potentially useful for information storage are ferroelectric materials. Just like with ferromagnetic materials, used for example in conventional audio tapes, ferroelectric materials display a hysteresis behavior with regards to their electrical polarization under the influence of an external electrical field.

Ferroelectric materials are a subgroup of noncentrosymmetric crystalline materials that have a spontaneous electrical polarization, the direction of which can be altered by an external electrical field. The polarization P versus applied electrical field E dependency shows hysteresis behavior, with P having two stable remanent values ($+P_r$ and $-P_r$) when E=0. The (reverse) electrical fields that must be applied to annihilate the existing polarization (P=0) are termed the coercive fields ($+E_c$ and $-E_c$). The term "ferroelectric" was coined because the P-E relation of these materials is very similar to the B-H relation of ferromagnetic materials. This hysteresis behavior is the basis of the use of both kinds of materials in memory devices. Ferroelectrics are also analogous to ferromagnets in that they are characterized by a Curie temperature $T_c$ (above which they become paraelectrical) and that they have an internal domain structure.

The hysteresis loop, shown in FIG. 1, is caused by the existence of permanent electrical dipoles. The curve starts at the origin (P=O) when the material is first produced because the ferroelectric domains are randomly oriented. When the external field is applied, the $B^{4+}$ ions become displaced in the direction of the field, and domains that are more favorably aligned with the field grow at the expense of those that are not. This procession results in a rapid and major polarizing effect until a saturation level $P_s$ (=saturation polarization) is reached, when the polarization vector of most of the domains are aligned with the field (dashed curve in FIG. 1). Removal of the field at this point eliminates any normal ionic polarization, but the $B^{4+}$ ions remain in their field-oriented sites, and a remanent polarization $+P_r$ is observed at E=O. In order to remove this polarization, it is necessary to apply an opposing field to revert half of the domains to favor the new field direction. That condition occurs when the opposing field reaches the material-specific coercive field $-E_c$. Continuation of the field cycle inverts the polarization to another saturation level, and removal of the negative field leaves the remanent polarization $-P_r$. Further cycles of the electrical field retrace the original path, creating a continuous hysteresis loop. The initial condition of P=O when E=O can only be again achieved by short-circuiting the capacitor and subjecting it to a temperature above $T_c$ to generate a new system of random ferroelectric domains.

Some inorganic (ceramic) ferroelectric materials have the perovskite structure, i.e. $ABO_3$, with A=a large divalent metal cation and B=a small tetravalent metal cation. Examples include $BaTiO_3$, $PbTiO_3$ and $PbZr_xTi_{1-x}O_3$ (PZT). The structure consists of 12 coordinated $A^{2+}$ ions on the corners of a cube, octahedral $O^{2-}$ ions on the faces, and tetrahedral $B^{4+}$ ions in the center (see for example FIG. 2). The Curie temperature in these materials is associated with a structural transition from regular cubic above $T_c$ to a distorted tetragonal form below $T_c$.

The hysteresis loop typical of ferroelectrical materials is the basis for ferroelectric random access memory (FRAM) devices. As ferroelectric materials possess two stable polarization directions at zero field, they can be used as nonvolatile memory elements. The direction of polarization is used to store information, a logical "0" corresponding to one direction and a logical "1" corresponding to the other direction. Generally, the device structure used in FRAM cells is either the ferroelectric field-effect transistor (FEFET) or the ferroelectric capacitor (FECAP). Computer memory devices utilizing the electrooptical properties of ferroelectric materials have also been described [Munroe, M. R.; Snaper, A. A.; Gregory, G. D. (1972) U.S. Pat. No. 3,675,220: "Planar random access ferroelectric computer memory." and Ogdfen, T. R.; Gookin, D. M. (1988) U.S. Pat. No. 4,731,754: "Erasable optical memory material from a ferroelectric polymer."].

Ferroelectric memory devices are generally susceptible to three forms of degradation in performance during use:

Electrical fatigue, which is defined as a decrease in the magnitude of the switchable polarization with increasing number of switching cycles.

Imprint failure, which is a polarization-driven field-shift of the hysteresis loop.

Aging, which is an ill-defined term generally indicating a degradation of the ferroelectric properties (capacitance and dielectric loss) with time.

These phenomena apparently derive from relaxation processes occurring at crystal boundaries. Fatigue and imprint are related to charge trapping at domain boundaries.

Recent work at the experimental level has shown that nanometer-scale polarization domains can be created in inorganic ferroelectric thin films using a conductive atomic force microscope (AFM). Domains as small as 30 nm diameter can be formed in a ferroelectric organic thin film on a conductive substrate by applying electrical pulses with an Au-conductive AFM tip. Binary information can be "written" by changing the polarity of the applied electrical pulses and "read" by using piezoelectrical measurements [Matsushige, K., Yamada, H.; Tanaka, H.; Horiuchi, T.; Chen, X. Q. (1998) Nanotechnology 9,208–211: "Nanoscale control and detection of electric dipoles in organic molecules."]

The miniaturization of electronic components by using particle technology on the nanoscale is a way to circumvent some of the physical limits and expense of conventional methods of fabrication [Goldhaber-Gordon, D.; Montemerlo, M. S.; Love, J. C.; Opiteck, G. J.; Ellenbogen, J. C. (1997) *Overview of Nanoelectronic Devices*; The MITRE Corporation (http://www.mitre.org/technology/nanotech), and Ellenbogen, J. C. (1998) *A Brief Overview of Nanoelectronic Devices*; The MITRE Corporation http://www.mitre.org/technology/nanotech).].

EP 0 788 149 A1 describes a method of depositing nanometer scale particles on a substrate in which Au particles are coated with negatively charged citrate ions, and the substrate is treated with a positively charged surfactant such that the opposite charges on the substrate and the Au particles are attracted to each other, and a thin film of particles is thus deposited. This structure is used as a tunnelling-gate in a transistor-like arrangement. Additionally in this document, a memory device is considered, based on the storage of information in the form of an excess electron. One bit of information according to the invention of this document corresponds to the presence or absence of one electron on the individual particle.

There are various ways to synthesize crystalline particles of ferroelectric materials on the nanoscale such as $BaTiO_3$ and $PbTiO_3$, which are known in the art. Surface modification of these particles by adsorption or covalent attachment makes it possible to change their interfacial properties without changing the intrinsic properties of the core material. Surface modification is useful for dispersing particles, immobilizing them onto surfaces, embedding them in organic films, etc. Such possibilities have already been demonstrated with ferroelectric particles. PZT particles 70 nm in diameter were silylated, spread as monoparticulate layers on water surfaces, and transferred to conductive glass substrates [Kotov, N. A.; Zavala, G.; Fendler, J. H. (1995) *J. Phys. Chem.* 99, 12375–12378: "Langmuir-Blodgett films prepared from ferroelectric lead zirconium titanate particles."]. These layers exhibited ferroelectric properties, as was evidenced by polarization measurements [Kotov, N. A. et al. (1995) ibid.]

Nevertheless, there are problems with these techniques: the ferroelectric properties of inorganic thin films ($\leq 10$ nm) tend to disappear due to some defects of the structures and/or composition at the interface, while the polarization domains written into the organic thin films are not stable temporally [Matsushige, K., Yamada, H.; Tanaka, H.; Horiuchi, T.; Chen, X. Q. (1998) Nanotechnology 9, 208–211: "Nanoscale control and detection of electric dipoles in organic molecules."]

Also, today's ferroelectric memory cells rely essentially on bulk-effect behavior for their function. These devices are susceptible to degradation in performance by various relaxation processes occurring at the crystal boundaries. Although significant steps have been made toward write/read ferroelectric memory capabilities below 100 nm, the approaches so far have not shown much promise for development into practical memory elements.

Accordingly there exists a need in the art for an efficient method of storing information based on ferroelectric devices which do not exhibit the degradation and/or instability behavior hitherto encountered with conventional ferroelectric devices.

The object of the present invention is to provide a method of storing information based on ferroelectric particles, which method allows a miniaturization of memory devices down to the nanometer scale whilst at the same time avoiding instability and degradation behavior commonly encountered with ferroelectric devices.

The object is solved by a method of producing a ferroelectric memory which method comprises:

a) providing ferroelectric particles 10, 10', b) providing a substrate 30, c) orientating at least a subset of said ferroelectric particles such that there is an axis of said particles along which axis a dipole moment may be directed in the ferroelectric state, said axis having an orientation the average of which is in at least one predetermined direction with regard to a surface of said substrate, d) allowing said ferroelectric particles to attach to said substrate.

In one embodiment, the order of steps c) and d) may be reversed. In one embodiment, the order of steps a) and b) may be reversed.

It is also envisaged that said axis may have an orientation the average of which is in two or more non-identical predetermined directions with regard to a surface of said substrate. "The average of which" is meant to designate a state in which, within an ensemble of particles, the average orientation of these particles within that ensemble is the predetermined direction with regard to a surface of said substrate.

In one embodiment said at least one predetermined direction is essentially perpendicular to a surface of said substrate.

In another embodiment said at least one predetermined direction is at an oblique angle to a surface of said substrate. "Oblique" in this context is meant to signify any value x taken from the range $0° < x < 180°$. Preferably x is taken from the range $45° \leq x \leq 135°$.

The object is also solved by a method of producing a ferroelectric memory which method comprises:

a) providing ferroelectric particles 10, 10', b) providing a substrate 30, c) orientating the electrical dipoles 20, 20' of said ferroelectric particles such that the orientation of each dipole is essentially perpendicular to a surface of said substrate, d) allowing said ferroelectric particles to attach to said substrate.

In one embodiment the order of steps a) and b) may be reversed. In one embodiment the order of steps c) and d) may be reversed.

It is preferred that said ferroelectric particles attach to said substrate in a manner that they are separated from each other on said substrate. This can, for example, be achieved by chemical moieties attached to the particles, the moieties carrying a net charge each, which will lead to a mutual repulsion between the particles.

In a preferred embodiment said ferroelectric particles attach to said substrate by electrostatic interactions.

In one embodiment, said orientating occurs by electrostatic interactions. This can, for example, be achieved by chemical moieties, carrying a net charge each, which are attached to said particles, which charges cause the particles to be orientated in a specific orientation.

It is preferred that said substrate exhibits charges of one electrical polarity, and wherein said ferroelectric particles exhibit charges of the opposite electrical polarity.

In one embodiment of the invention said charges exhibited by said substrate are generated by application of an electrical potential and optionally by adjusting a pH-value, and/or they are charged moieties appended to said substrate. The process of generating/changing charges on a substrate by applying an electrical potential in order to attract particles of opposite charge is referred to as "electrophoretic deposition", e.g. hereafter in the example section.

In a preferred embodiment said charges exhibited by said ferroelectric particles are charged moieties appended to said particles.

It is preferred that said charged moieties are negative and comprise groups which can be represented by the general form $XO^-$ or $XS^-$, where X is covalently attached to $O^-$ or $S^-$ by one of its constituent atoms, said constituent atom being an atom selected from the second through sixteenth column and second through sixth row of the Periodic Table. Preferably $XO^-$ is selected from the group comprising phenolate and carboxylate (a C-atom being the link to $O^-$), phosphate and phosphonate (a P-atom being the link to $O^-$), sulfate and sulfonate (an S-atom being the link to $O^-$), borate (a B-atom being the link to $O^-$), Arsenate and Arsenite (an As-atom being the link to $O^-$). Preferably $XS^-$ is selected from the group comprising thiolate and dithiocarbamate (a C-atom being the link to $S^-$), dithiophosphate and dithiophosphonate (a P-atom being the link to $S^-$).

In one preferred embodiment said charged moieties are positive and comprise groups which can be represented by the general form $C_4P^+$ or $C_3S^+$, where C is a carbon atom having $sp^3$ hybridisation, or by the general form $C_aNH_b^+$, where C is a carbon atom having either $sp^3$ or $sp^2$ hybridisation and the sum of the coefficients a and b equals 3 in the case of $sp^3$ hybridisation, or 2 in the case of $sp^2$ hybridisation.

Positively charged moieties of the form $C_4P^+$ are known generally as "phosphonium" ions and those of the form $C_3S^+$ are known generally as "sulfonium" ions. Another way to express these moieties is $R(PR^1R^2R^3)^+$ and $R(SR^1R^2)^+$, respectively, where R is an alkyl or aryl residue used for the appendage, and $R^1$, $R^2$, and $R^3$ are alkyl or aryl groups which may be the same or different and may be connected (cyclic). For the purpose of the present invention, the latter groups should not be very large, and suitable examples are methyl ($CH_3$) and ethyl ($CH_2CH_3$) groups. It should also be noted that the alkyl or aryl groups can themselves be substituted. For example, 2-hydroxyethyl ($CH_2CH_3OH$) groups might be used instead of ethyl groups to enhance the polarity. Positively charged moieties of the form $C_aNH_b^+$ are known generally as "ammonium ions". The possibilities of these N-based moieties are greater because H can be used instead of alkyl or aryl groups, but there must be at least one alkyl or aryl R group for the appendage. Another way to express these moieties is $RNH_3^+$ ("primary" ammonium), $RNR_1H_2^+$ ("secondary" ammonium), $RNR^1R^2H^+$ ("tertiary" ammonium), and $RNR_1R^2R^{3+}$ ("quaternary" ammonium) ions. As with the phosphonium and sulfonium moieties, the $R^1$, $R^2$, and $R^3$ groups may be the same or different and may be connected (cyclic). An important class of heterocyclic tertiary and quaternary ammonium moieties are those derived from pyridine ("pyridinium" ions).

It is preferred that said charged moieties are appended via silylation.

It is also preferred that said charged moieties are appended via complexation. "Complexation" here refers to a coordination complex formed at the surface of the particle involving one or more metal atoms intrinsic to the particle and the donor atoms of a ligand.

In a preferred embodiment said charged moieties are metal complexes.

It is preferred that said charged moieties are appended to a polymer.

In principle, any charged polymer that can bind to the particle surface could be useful. Some groups of the polymer would interact with atoms on the particle surface to anchor it to the particle and the rest would provide charged moieties to interact with the solvent. In Example 6, see below, carboxylic acid groups of the poly(acrylic acid) serve both functions, binding to the barium titanate particle principally through the titanium atoms. There are numerous other kinds of polymers that could be used instead, including poly (phosphates), poly(amino acids), and poly(ethylene imine).

In a preferred embodiment said ferroelectric particles are single-domain particles.

It is preferred that said particles are 5–200 nm in size, preferably 10–150 nm, more preferably 20–100 nm in size, the size of each particle being determined by the longest dimension of said particle.

Preferably said ferroelectric particles are formed by compounds selected from the group comprising mixed oxides containing corner sharing oxygen octahedra.

In a preferred embodiment said ferroelectric particles are formed by compounds selected from the group comprising perovskite-type compounds.

It is preferred that said ferroelectric particles are formed by compounds selected from the group comprising tungsten-bronze type compounds.

Preferably said ferroelectric particles are formed by compounds selected from the group comprising bismuth oxide layer-structured compounds.

In a preferred embodiment said ferroelectric particles are formed by compounds selected from the group comprising lithium niobate or lithium tantalate.

In one embodiment said ferroelectric particles are formed by compounds selected from the group which can be represented by the general form $A_lB_mO_n$, wherein A is selected from the group comprising $Li^+$, $Na^+$, $K^+$, $Ca^{2+}$, $Sr^{2+}$, $Ba^{2+}$, $La^{3+}$ (or other rare earth metal ion), $Co^{3+}$, $Cd^{2+}$, $Pb^{2+}$, and $Bi^{3+}$.

B is selected from the group comprising $Mg^{2+}$, $Ti^{4+}$, $Zr^{4+}$, $Hf^{4+}$, $Nb^{5+}$, $Ta^{5+}$, $W^{5+}$, $Mn^{3+}$, $Fe^{3+}$, $Ni^{2+}$, $Zn^{2+}$, $Al^{3+}$, $Ga^{3+}$, $Sn^{4+}$, and $Sb^{5+}$, and l, m, and n are integral values such that the sum of positive valences contributed by the atoms in groups A and B equals 2 n.

It is preferred that said ferroelectric particles form a layer on said substrate.

Preferably, said layer has a thickness in the range of 5–200 nm.

In one embodiment said layer has a thickness in the range of 10–150 nm.

It is preferred that said layer is a monolayer.

In one embodiment of the invention, said substrate forms part of an electrode, said electrode being at least partially immersed in a suspension of said particles.

It is preferred that said electrode forms part of an electrical cell, an electrical field being created in said electrical cell, said electrical field causing said substrate to exhibit charges of one polarity.

It is preferred that an adjustment of a pH-value of said suspension is used to cause said substrate to exhibit charges of one polarity.

It is also preferred that an adjustment of a pH-value of said suspension is used to cause said particles to exhibit charges of one polarity.

In a preferred embodiment, said pH-value of said suspension is adjusted to the range of 7–9.

It is preferred that, after attachment of said particles to said substrate, said particles are fixed to said substrate, preferably by means of drying and/or crosslinking and/or drying under vacuum.

As used herein, "attachment" is meant to designate any contacting interaction. "Attachment" can, for example, occur by electrostatic forces, but other forces are not intended to be excluded, as used herein. If an attachment by covalent forces is intended, it is herein referred to explicitly as "attachment by covalent interactions". The term "being fixed", however, is meant to designate a contacting interaction which is primarily covalent in its nature.

In a preferred embodiment, said ferroelectric particles attach to said substrate by affinity interactions.

In a preferred embodiment, said ferroelectric particles attach to said substrate by covalent interactions.

The object is also solved by a method of storing information on a substrate wherein, in a device obtainable by a method of producing a ferroelectric memory according to the present invention, the electrical dipoles of said particles are directed by directing means 140.

The object is furthermore solved by a method of storing information on a substrate wherein, in a device obtainable by a method of producing a ferroelectric memory according to the present invention, a permanent dipole moment in the ferroelectric state is created in all or at least a plurality of said particles by directing means 140, resulting in groups of particles having essentially the same permanent dipole moment.

A "group of particles" may be an array of e.g. 1×2, 2×2, 3×3, 4×4, 2×3, 2×4, 3×4, etc. particles.

In one embodiment said dipole moment in the ferroelectric state is essentially perpendicular to a surface of said substrate.

In another embodiment said dipole moment in the ferroelectric state is essentially at an oblique angle to a surface of said substrate.

It is preferred that said directing means is selected from the group comprising probes of scanning probe microscopes (SPM) for applying electrical pulses.

In a preferred embodiment of the invention, said creating of said dipole moment occurs by applying electrical pulses to individual ferroelectric particles and/or by applying electrical pulses to groups of particles.

In a preferred embodiment of the invention, said directing of said electrical dipoles occurs by applying electrical pulses to individual ferroelectric particles and/or by applying electrical pulses to groups of particles.

It should be mentioned that the term "directing said electrical dipoles" is meant to designate, for example, an action by which it is determined whether an electrical dipole points "up" or "down" along its axis of orientation. "Orientating said ferroelectric particles" is meant to designate, for example, an action by which an axis of said particles is established along which a "directing action" of dipoles can occur.

The object is also solved by a memory device comprising a substrate, and
ferroelectric particles attached thereto, wherein the orientation of the electrical dipoles of said particles is, on average, at least one predetermined direction with regard to a surface of said substrate.

It is preferred that said at least one predetermined direction is an essentially perpendicular direction with regard to a surface of said substrate.

It should be noted that the term "at least one predetermined direction" is meant to enclose embodiments, in which there are two or more, non-identical predetermined directions.

In another embodiment said at least one predetermined direction is an oblique direction with regard to a surface of said substrate. "Oblique direction" in this context means that it forms an angle with said surface of said substrate the value x of which is taken from the range $0°<x<180°$. Preferably x is taken from the range $45°\leq x \leq 135°$.

It is preferred that said ferroelectric particles attach to said substrate in a manner that they are separated from each other on said substrate.

In a preferred embodiment of the invention, said ferroelectric particles attach to said substrate by electrostatic interactions.

It is preferred that said substrate exhibits charges of one electrical polarity, and wherein said ferroelectric particles exhibit charges of the opposite electrical polarity.

It is preferred that said charges exhibited by said substrate are generated by application of an electrical potential and/or by adjusting a pH-value, and/or they are charged moieties appended to said substrate.

It is preferred that said charges exhibited by said ferroelectric particles are charged moieties.

In one embodiment said charges exhibited by said ferroelectric particles are charged moieties appended to said particles.

It is preferred that said charged moieties are negative and comprise groups which can be represented by the general form $XO^-$ or $XS^-$, where X is covalently attached to $O^-$ or $S^-$ by one of its constituent atoms, said constituent atom being an atom selected from the second through sixteenth column and second through sixth row of the Periodic Table. Preferably $XO^-$ is selected from the group comprising phenolate and carboxylate (a C-atom being the link to $O^-$), phosphate and phosphonate (a P-atom being the link to $O^-$), sulfate and sulfonate (an S-atom being the link to $O^-$), borate (a B-atom being the link to $O^-$), Arsenate and Arsenite (an As-atom being the link to $O^-$). Preferably $XS^-$ is selected from the group comprising thiolate and dithiocarbamate (a C-atom being the link to $S^-$), dithiophosphate and dithiophosphonate (a P-atom being the link to $S^-$).

In one embodiment said charged moieties are positive and comprise groups which can be represented by the general form $C_4P^+$ or $C_3S^+$, where C is a carbon atom having sp3 hybridisation, or by the general form $C_aNH_b^+$, where C is a carbon atom having either $sp^3$ or $sp^2$ hybridisation and the sum of the coefficients a and b equals 3 in the case of $sp^3$ hybridisation, or 2 in the case of $sp^2$ hybridisation.

In one embodiment said charged moieties are appended via silylation.

It is preferred that said charged moieties are appended via complexation. "Complexation" here refers to a coordination complex formed at the surface of the particle involving one or more metal atoms intrinsic to the particle and the donor atoms of a ligand.

In one embodiment said charged moieties are metal complexes.

Preferably said charged moieties are appended to a polymer.

In a preferred embodiment of the invention, said ferroelectric particles are single-domain particles.

It is preferred that said particles are 5–200 nm in size, preferably, 10–150 nm, more preferably 20–100 nm in size, the size of each particle being determined by the longest dimension of said particle.

In a preferred embodiment of the invention, said ferroelectric particles are formed by compound selected from the group comprising mixed oxides containing corner sharing oxygen octahedra.

Preferably said ferroelectric particles are formed by compounds selected from the group comprising perovskite-type compounds.

In a preferred embodiment said ferroelectric particles are formed by compounds selected from the group comprising tungsten-bronze type compounds.

Preferably said ferroelectric particles are formed by compounds selected from the group comprising bismuth oxide layer-structured compounds.

It is preferred that said ferroelectric particles are formed by compounds selected from the group comprising lithium niobate or lithium tantalate.

In one embodiment said ferroelectric particles are formed by compounds selected from the group formed which can be represented by the general form $A_lB_mO_n$, wherein A is selected from the group comprising $Li^+$, $Na^+$, $K^+$, $Ca^{2+}$, $Sr^{2+}$, $Ba^{2+}$, $La^{3+}$ (or other rare earth metal ion), $Co^{3+}$, $Cd^{2+}$, $Pb^{2+}$, and $Bi^{3+}$.

B is selected from the group comprising $Mg^{2+}$, $Ti^{4+}$, $Zr^{4+}$, $Hf^{4+}$, $Nb^{5+}$, $Ta^{5+}$, $W^{5+}$, $Mn^{3+}$, $Fe^{3+}$, $Ni^{2+}$, $Zn^{2+}$, $Al^{3+}$, $Ga^{3+}$, $Sn^{4+}$, and $Sb^{5+}$, and l, m, and n are integral values such that the sum of positive valences contributed by the atoms in groups A and B equals 2 n.

It is preferred that said ferroelectric particles form a layer on said substrate.

Preferably, said layer has a thickness in the range of 5–200 nm.

Preferably, said layer is a monolayer.

The object is also solved by a use of a ferroelectric memory produced by the method of producing a ferroelectric memory according to the present invention, or by the use of a ferroelectric memory obtainable by the method of producing a ferroelectric memory according to the present invention, or by the use of a memory device according to the present invention for the storage of binary information, wherein, preferably, said ferroelectric memory or said memory device is used in an electronic component.

The object is also solved by a method of storing information on a substrate which method comprises:
  providing ferroelectric particles,
  providing a substrate,
  providing the substrate with receptors for said ferroelectric particles,
  providing said ferroelectric particles with ligands enabling said particles to bind to said receptors,
  allowing said ferroelectric particles to bind to said substrate, whereby said ferroelectric particles form a monolayer, and
  orientating the electrical dipoles of said ferroelectric particles by orientating means.

The object is also solved by a memory device comprising
  a substrate, and
  a monolayer of ferroelectric particles bound thereto.

The object is also solved by the use of a memory device manufactured by the method according to the present invention or of a memory device obtainable by the method according to the present invention or of a memory device according to the present invention, for the storage of binary information.

In one embodiment of the method according to the present invention, it is preferred that the binding of said ferroelectric particles to said substrate is governed by electrostatic interactions.

According to a preferred embodiment, said receptors provide charges of one electrical polarity to said substrate.

In one embodiment, it is preferred that said ligands provide charges of the opposite electrical polarity to said particles.

According to one preferred embodiment, said receptors are charges generated by application of an electrical field and/or by adjusting a pH-value.

It is preferred that said ligands are charged moieties affixed to silane derivatives, wherein it is especially preferred that said affixed moieties are selected from the group comprising 3-aminopropyl and N-(2-aminoethyl)-3-aminopropyl.

In a preferred embodiment, said ferroelectric particles are uniformly sized.

Preferably, said ferroelectric particles are single-domain particles.

It is preferred that said particles have essentially cubic and/or essentially spherical morphology.

In one embodiment said particles form plate-like crystals.

In one embodiment said particles are 5–200 nm in size, preferably 10–150 nm, more preferably 20–100 nm, this numerical value referring to either the diameter or the length of the longest edge of the particle.

In a preferred embodiment, said particles are crystalline.

It is also preferred that said ferroelectric particles are formed by inorganic ferroelectric compounds.

In a preferred embodiment, said ferroelectric particles are formed by compounds selected from the group comprising perovskite-type compounds, barium titanate, lead circonate, wherein, more preferred, the perovskite-type compounds are selected from the group comprising $BaTiO_3$, $PbTiO_3$, $PbZr_xTi_{1-x}O_3$ (PZT), $ABX_3$, wherein A is selected from the group comprising $Ca^{2+}$, $Ba^{2+}$, $Pb^{2+}$, $Sr^{2+}$, $Cd^{2+}$, $K^+$, $Na^+$, and rare earth metals, B is selected from the group comprising $Ti^{4+}$, $Zr^{4+}$, $Sn^{4+}$, $Nb^{5+}$, $Hf^{4+}$, $Ta^{5+}$, $W^{5+}$, and $Ga^{3+}$, and X is selected from the group comprising O, F, Cl, Br, and I.

In a preferred embodiment, said monolayer has a thickness in the range of 5–100 nm.

Preferably, said substrate is electrically conducting.

The invention may also provide that said substrate is smooth compared to the dimensions of said particles.

In one embodiment of the method according to the present invention, said substrate is formed by a substance selected from the group comprising glass, surface-modified glass, glass, that has an extra layer attached to its surface, glass with an extra layer of fluorine-doped tin oxide ($F—SnO_2$).

It is preferred that said substrate forms part of an electrode in an electrical cell, said electrical cell being capable of adopting an open-circuit condition ("open-circuit electrical cell") or a closed-circuit condition ("closed-circuit electrical cell"), wherein it is preferred that said electrode is at least partially immersed in a suspension of said particles, and wherein it is also preferred that said electrical cell is polarised by application of an external electrical field, said electrical cell now being a closed-circuit electrical cell.

In a preferred embodiment, a pH-value of said suspension is in the range of 2–6 in said open-circuit electrical cell, and/or a pH-value of said suspension is in the range of 7–9 in said closed-circuit electrical cell.

In a preferred embodiment, after the binding of said particles to said substrate, said monolayer is fixed to said substrate, wherein it is preferred that said monolayer is fixed to said substrate by means of drying and/or crosslinking and/or drying under vacuum.

In a preferred embodiment, said orientating means is selected from the group comprising probes of scanning probe microscopes (SPM) for applying electrical pulses.

It is preferred that said orientating of the electrical dipoles occurs by applying electrical pulses to individual ferroelectric particles.

In one embodiment of the invention, the binding of said ferroelectric particles to said substrate is governed by affinity interactions.

In another embodiment of the invention, the binding of said ferroelectric particles to said substrate is governed by covalent interactions.

In a preferred embodiment of the memory device according to the invention, said ferroelectric particles are bound to said substrate by interactions of receptors on said substrate with ligands on said ferroelectric particles.

It is preferred that said ferroelectric particles are bound to said substrate by electrostatic interactions.

In a preferred embodiment, said receptors provide charges of one electrical polarity to said substrate, and/or said ligands provide charges of the opposite electrical polarity to said particles.

It is preferred that said receptors are charges generated by application of an electrical field and/or by adjusting a pH-value.

It is preferred, that said ligands are selected from the group comprising (3-aminopropyl)triethoxysilane and N-(2-aminoethyl)-3-aminopropyltrimethoxysilane.

In a preferred embodiment, said ferroelectric particles are uniformly sized.

It is preferred that said ferroelectric particles are single-domain particles.

The invention may also provide that said particles have essentially cubic and/or essentially spherical morphology.

In a preferred embodiment said particles are 5–200 nm in size, preferably 10–150 nm, more preferably 20–100 nm, the size being determined by the longest dimension of the particle. This longest dimension can, for example, be the diameter or the length of the longest edge of the particle.

In a preferred embodiment, said particles are crystalline.

In a preferred embodiment, said ferroelectric particles are formed by inorganic ferroelectric compounds.

It is also preferred that said ferroelectric particles are formed by compounds selected from the group comprising perovskite-type compounds, potassium sodium tartrate, barium titanate, lead circonate wherein, more preferred, the perovskite-type compounds are selected from the group comprising $BaTiO_3$, $PbTiO_3$, $PbZr_xTi_{1-x}O_3$ (PZT), $ABX_3$, wherein A is selected from the group comprising $Ca^{2+}$, $Ba^{2+}$, $Pb^{2+}$, $Sr^{2+}$, $Cd^{2+}$, $K^+$, $Na^+$, and rare earth metals, B is selected from the group comprising $Ti^{4+}$, $Zr^{4+}$, $Sn^{4+}$, $Nb^{5+}$, $Hf^{4+}$, $Ta^{5+}$, $W^{5+}$, and $Ga^{3+}$, and X is selected from the group comprising O, F, Cl, Br, and I.

In a preferred embodiment, said monolayer has a thickness in the range of 5–100 nm.

Preferably, said substrate is electrically conducting.

The invention may also provide that said substrate is smooth compared to the dimensions of said particles.

In a preferred embodiment of the memory device according to the present invention, said substrate is formed by a substance selected from the group comprising glass, surface-modified glass, glass, that has an extra layer attached to its surface, glass with an extra layer of fluorine-doped tin oxide ($F-SnO_2$).

In a preferred embodiment of the use according to the present invention, the memory device is used in an electronic component.

"Ferroelectric particles" are particles exhibiting ferroelectric properties. The term "substrate" refers to any entity to which particles can attach. The term "monolayer" of substance A refers to a film comprising a single layer of molecules/atoms of substance A. As used herein the term "the binding of . . . is governed by electrostatic interactions" refers to a relation in which the binding is accompanied by and/or due to electrostatic interactions. The terms "receptor" and "ligand" refer to two entities capable of interacting with and binding to each other. They can be functional groups, groups with opposite electrical polarity, but also merely charges of opposite electrical polarity induced by the application of an electrical field or generated by other means. The term "particles are uniformly sized" means that the particles, on average, have essentially the same size. The term "single-domain particles" is meant to designate the fact that such a particle is a single ferroelectric domain. A ferroelectric domain is an entity in which all electrical dipoles are aligned resulting in a net electrical polarisation. The term "electrically conducting" refers to a capability of transporting charges, electrons, electron-holes, ions, etc. The term "said substrate is smooth compared to the dimensions of said particles" is meant to designate a state in which the roughness of the substrate measured by the mean dimension of its peaks (and the enclosed valleys) is smaller than the mean dimensions of the particles. The terms "open-circuit condition" and "closed-circuit condition" designate an electrical circuit which is open and closed respectively. The term "said electrode is at least partially immersed" designates a state in which all or part of the electrode's surface is immersed.

The present invention uses arrays of ferroelectric particles, preferably as individually addressable, non-volatile memory elements. In one embodiment, the particles of choice exhibit a narrow size distribution and are highly crystalline (nanocrystals), single-domain ferroelectric substances. According to the present invention, one bit of information corresponds to the "up"- or "down"-direction of the electrical polarization of one individual particle. Alternatively, the memory unit cell can be made up of small arrays (e.g. 1×2, 2×2, 3×3, 2×3, 2×4, 4×4 . . . etc.) or clusters of particles instead of single particles.

The present invention provides the following advantages compared to the state of the art:

It enables the miniaturization of non-volatile ferroelectric memory elements down to the 100 nm scale and below.

The memory elements are not subject to degradation via mechanisms present in polycrystalline devices because the ferroelectric domains are isolated from one another as individual particles.

The readout method is non-destructive.

No state of the art memory device, based on ferroelectric or other aforementioned behaviour, provides all of these features.

Further features and advantages of the present invention will be apparent from the following description in connection with the drawings, wherein FIG. 1 illustrates a hysteresis curve typical of a ferroelectric material at a temperature below $T_c$;

Figure 1:
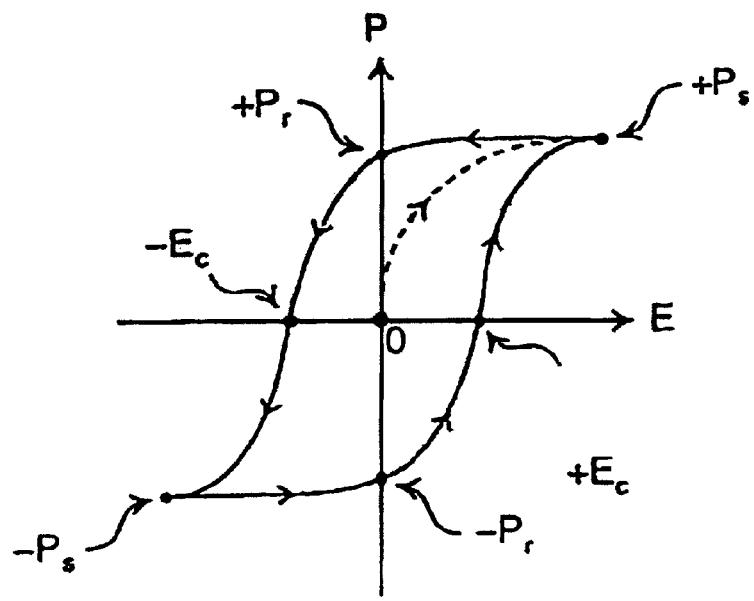
FIG. 1 illustrates a hysteresis curve typical of a ferroelectric material at a temperature below $T_c$. The dashed curve represents the polarization of the material when it is first produced, and the solid curve represents the hysteresis loop obtained after an applied electrical field exceeding the coercive field $E_c$ has permanently polarized the material.
Figure 2:
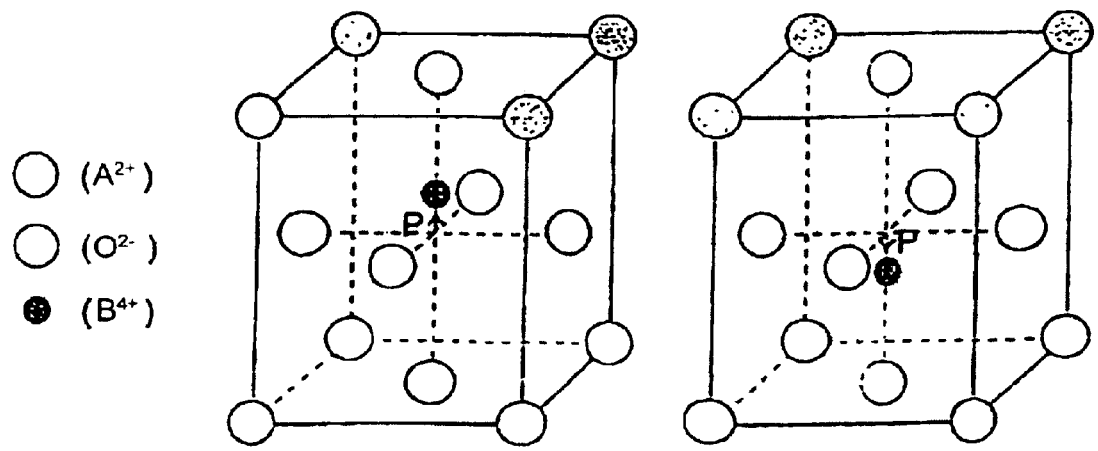
FIG. 2 illustrates a distorted cubic unit cell structure of a ferroelectric $ABO_3$ perovskite (below $T_c$)

FIG. 2 illustrates the distorted cubic unit cell structure of a ferroelectric $ABO_3$ perovskite (below $T_c$). The $B^{4+}$ ion can occupy positions slightly above or below the plane defined by $O^{2-}$ ions. Two of the six possible polarization (P) orientations are indicated. These six orientations are degenerated in the absence of an external electrical field. In the distorted tetragonal unit cell, the $B^{4+}$ ion has two stable positions, either above or below the oxide-ion plane. In either position, the $B^{4+}$ ion is not coincident with the negative charge center of the $O^{2-}$ ions by a small fraction (ca. 0.1) of the Ångstrom, thus creating an electrical dipole. This electrical di-pole spontaneously aligns with those in adjacent unit cells, resulting in the formation of a microstructural entity known as a ferroelectric domain and yielding a net electrical polarization over many unit cell dimensions. The energy barrier between the two possible positions for the $B^{4+}$ ion is sufficiently low to permit motion of the ion between sites by the coercion of an electrical field, and the material can thus be directionally polarized with ease. The direction of the electrical dipole remains until an opposite electrical field is applied. Ionic displacements typically respond to electrical field reversals up to frequencies of about $10^{13}$ Hz.

Barium titanate ($BaTiO_3$) is a suitable ferroelectric material in multilayer capacitors. Its Curie temperature $T_c$ is 120° and saturation polarization $P_s$ is 0.26 C. $m^{-2}$ at 23° C. Partial substitutions for $Ba^{2+}$ (such as $Sr^{2+}$, $Ca^{2+}$, $Pb^{2+}$, and $Cd^{2+}$) or $Ti^{4+}$ (such as $Zr^{4+}$, $Sn^{4+}$, and $Hf^{4+}$) are used to modify the dielectric behavior and temperature dependence of $BaTiO_3$. Undoped $BaTiO_3$ is a p-type semiconductor with an optical band gap of 3.2 eV.

Figure 3A:
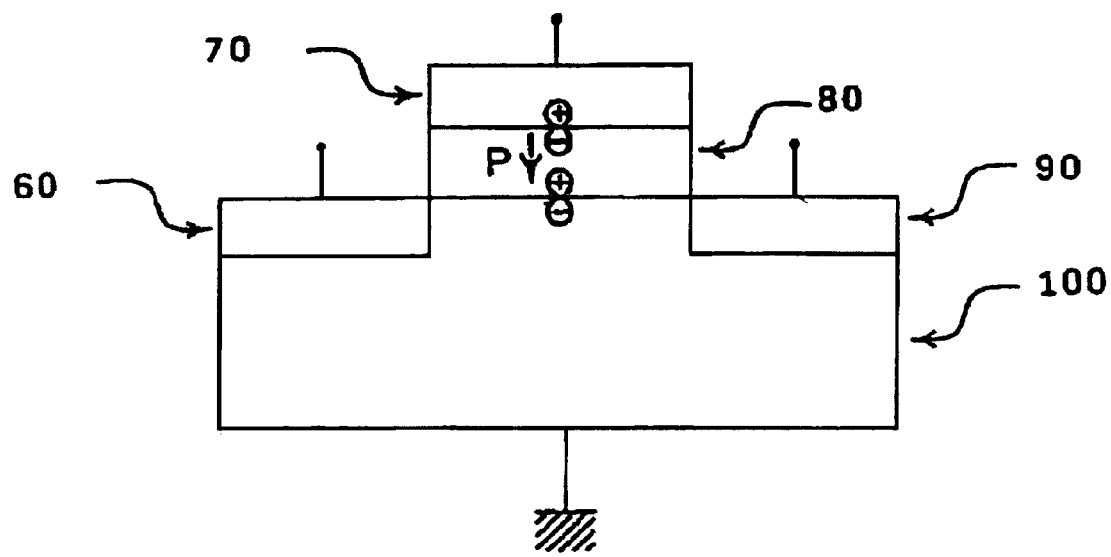
FIG. 3 illustrates the ferroelectric structures that are present in the two most common forms of FRAM devices, the FEFET (FIG. 3A) and the FECAP (FIG. 3B)
Figure 3B:
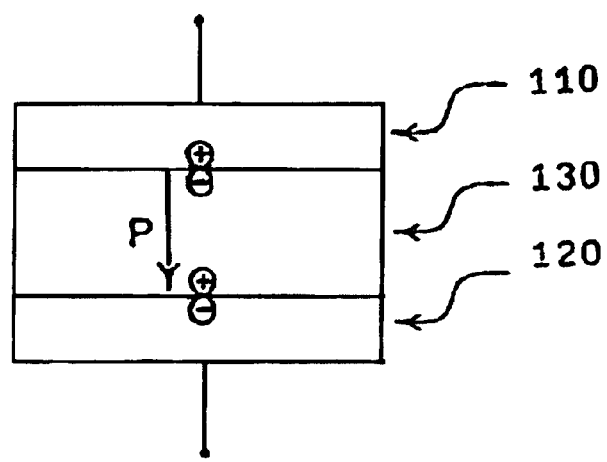

FIG. 3 illustrates the ferroelectric structures that are present in the two most common forms of FRAM devices, the FEFET (3A) and the FECAP (3B). Both structures contain polycrystalline ferroelectric materials.

The FEFET is a classical MOS transistor with source 60, gate 70, drain 90 and an Si-substrate 100, with the $SiO_2$ gate dielectric replaced by a thin film ferroelectric 80. In this case, the remanent polarization of the ferroelectric controls the channel conductivity. As such, the effective threshold voltage of the field-effect transistor depends on the direction of polarization. Hence, information readout is possible by determining the current level flowing through the device at constant gate voltage. This readout mechanism is non-destructive.

In the other type of FRAM cell, a FECAP is substituted for the conventional silicon dioxide capacitor in dynamic random access memory (DRAM) devices.

The FECAP typically consists of two electrodes 110 and 120 in parallel to the substrate, with the ferroelectric material 130 sandwiched in between. In this case, polarization of the ferroelectric gives rise to compensating charges in the electrodes, and a change in polarization due to switching results in a change in the electrode charge. Hence, the information content is probed by applying a voltage over the FECAP and measuring the displacement current as a voltage drop over a current-integrating bit-line capacitor. This voltage is then compared to a reference voltage corresponding to that of a non-switching FECAP. One problem with this type of FRAM cell is the fact that the readout mechanism destroys the original information content, so that the device has to be re-programmed.

Figure 4:
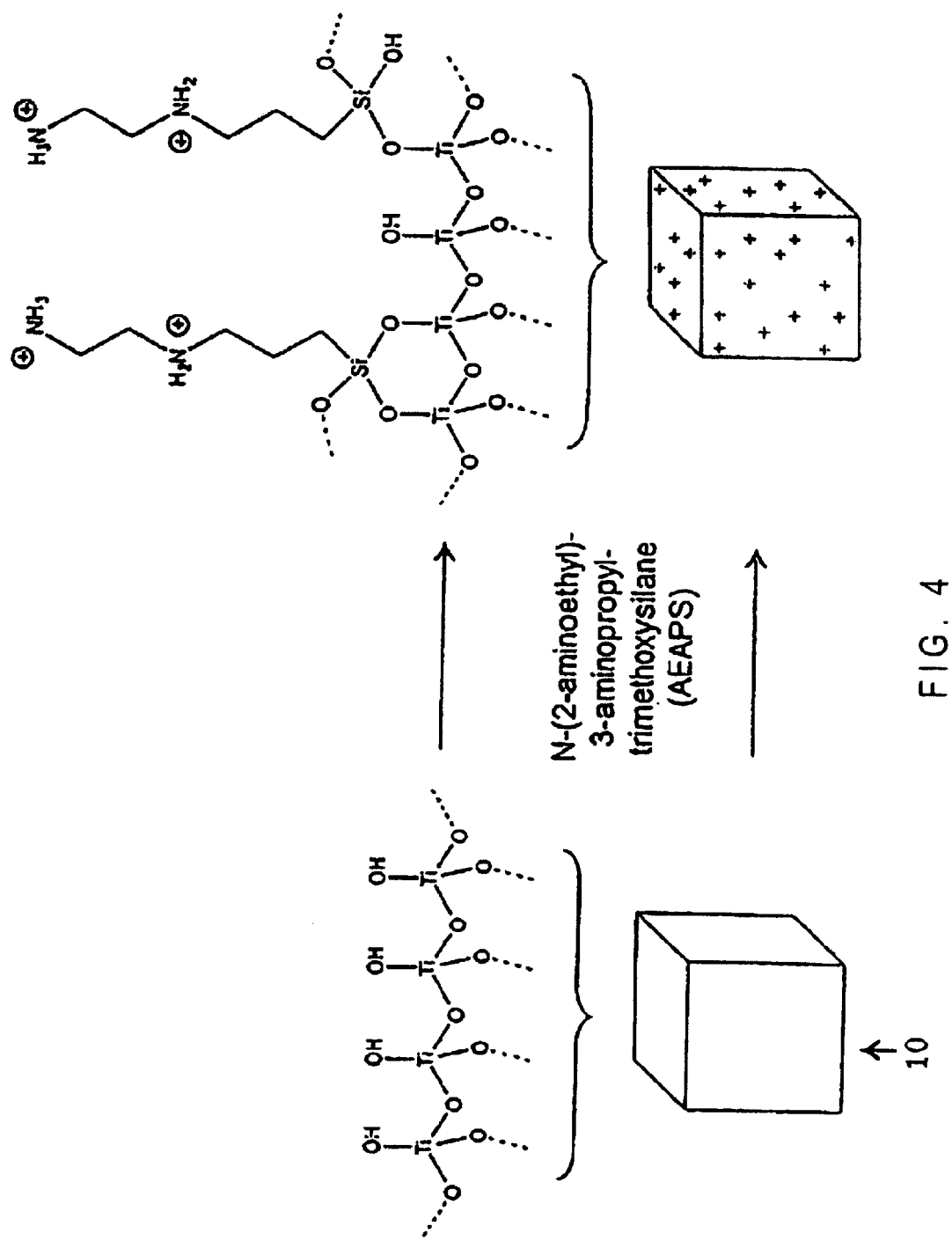
FIG. 4 illustrates a method of surface modification of cubic shaped $BaTiO_3$ particles using the silylating agent N-(2-aminoethyl)-3-aminopropyltrimethoxysilane.

FIG. 4 illustrates a method of surface modification of cubic shaped $BaTiO_3$ monoparticles 10 using the silylating agent N-(2-aminoethyl)-3-aminopropyltrimethoxysilane according to the present invention. This reagent condenses with —OH groups present on the particle surface to introduce positively charged —$NH_2^+$ and —$NH_3^+$ groups.

Figure 5A:
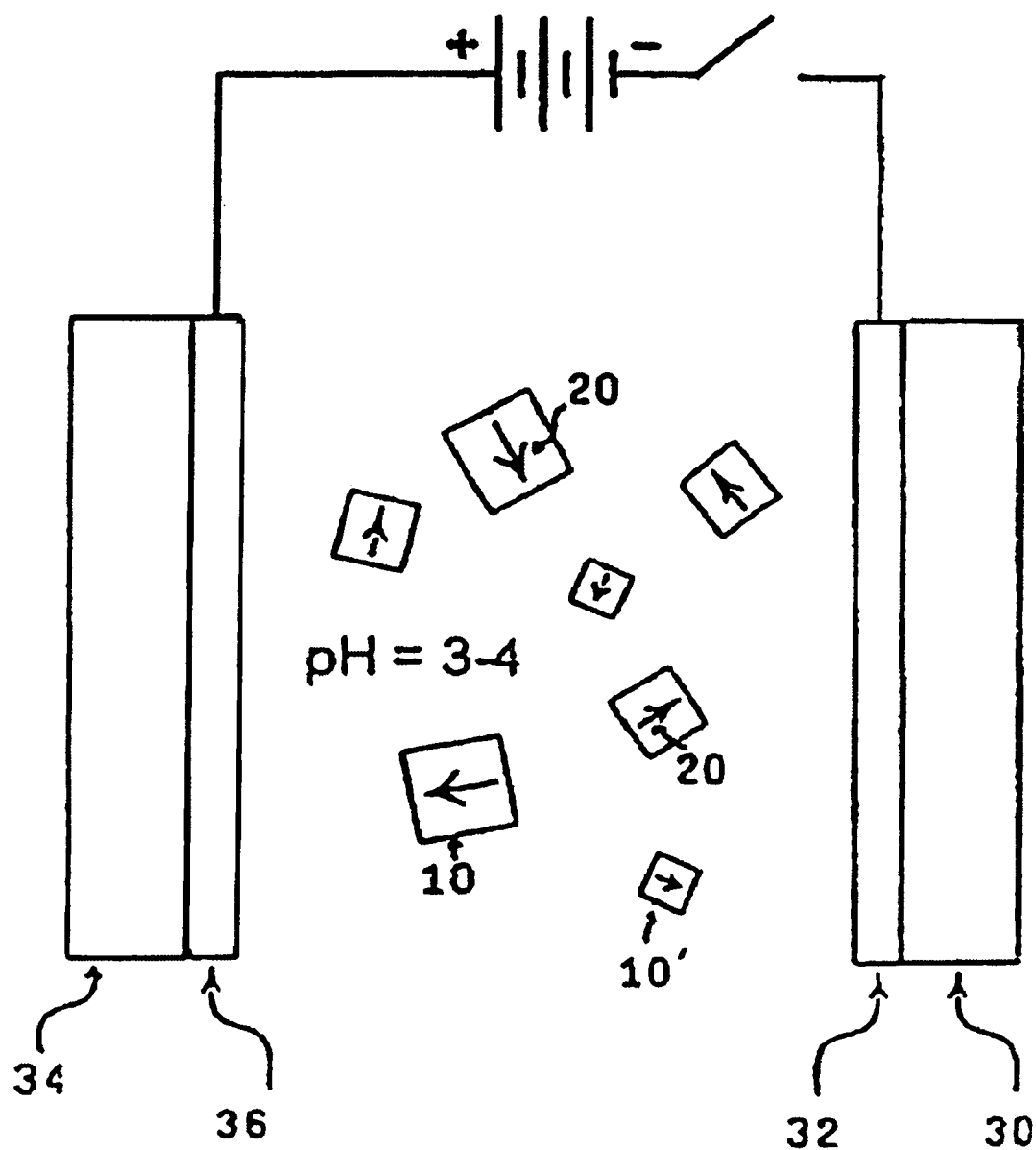
FIG. 5 illustrates a method for depositing a monoparticulate layer of $BaTiO_3$ particles on a TEC glass electrode.
Figure 5B:
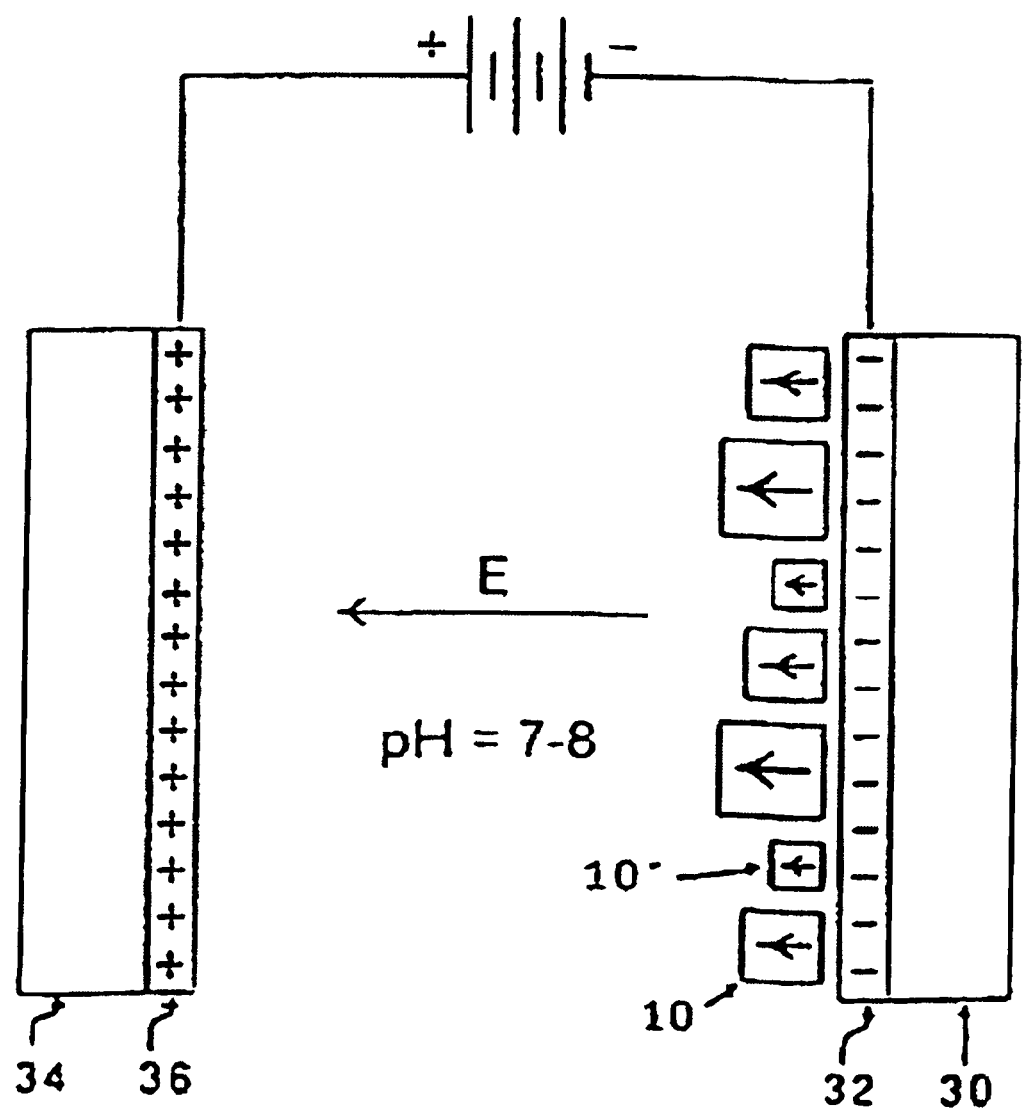

FIG. 5 illustrates a method for depositing a monoparticulate layer of $BaTiO_3$ particles on a TEC glass electrode according to the present invention. The substrate 30 has an additional layer 32 of F—$SnO_2$ on it. The $BaTiO_3$ particles in suspension have been surface modified with N-(2-aminoethyl)-3-aminopropyltrimethoxysilane as illustrated in FIG. 4. The opposite electrode 34 has a metal film 36 on it. Charges on the particles are omitted for simplicity. In FIG. 5A there is an open circuit and acidic pH, and the particles are dispersed and randomly oriented in the solution phase between the two electrodes. Both the particles and the F—$SnO_2$ layer are positively charged. In FIG. 5B there is a closed circuit and neutral pH, and the particles are adsorbed to the TEC glass electrode and oriented with their polarization dipoles pointed in the direction of the electrical field. The particles are positively charged and the F—$SnO_2$ layer is negatively charged. Gaps between the particles and between the particles and the F—$SnO_2$ layer contain the N-(2-aminoethyl)-3-aminopropyltrimethoxysilane groups. "+" indicates a positive charge, "−" a negative charge.

In more detail, FIGS. 4 and 5 illustrate a preferred method for preparing a monolayer of barium titanate particles oriented with their crystal axis perpendicular to the substrate according to the present invention. The particles which have a cubic morphology and are 20–70 nm in size, are commercially available [Advanced Powder Technology Pty Ltd, Nedlands, Western Australia (http://www.apt-powders.com).]. First, the particles are reacted with the silylating reagent N-(2-aminoethyl)-3-aminopropyltrimethoxysilane. This reaction essentially gives the particles positively charged organic (sub-monolayer) coatings by converting some of the hydroxyl (—OH) groups on the surface into secondary and primary ammonium (—$NH_2^+$ and —$NH_3^+$) groups (FIG. 4). Next, an electrical field is used to orient the particles while they are depositing onto a TEC (transparent electrical conducting) glass substrate (FIG. 5). The TEC glass is electrically conducting by virtue of a thin layer of fluorine-doped tin dioxide (F—$SnO_2$). Initially, an acidic (pH=3–4) suspension of the particles is placed between the electrodes under open circuit conditions (FIG. 5A). No adsorption occurs under these conditions because the surfaces of both the particles and the TEC glass (F—$SnO_2$) are positively charged at acidic pH. The circuit is then closed to create an electrical field between the electrodes, while the suspension is neutralized to pH=7–8 by the addition of base. Adsorption occurs under these conditions because the particles are positively charged but the TEC glass (F—SnO2) is negatively charged at neutral pH, especially when polarized negatively by the applied potential. The electrical field causes the particles to be oriented in the direction of the field during the adsorption process (FIG. 5B). Due to electrostatic attraction, the particles remain adsorbed to the TEC glass substrate after the electrical field is removed. The adsorbed layer can be chemically cross-linked afterwards to stabilize it towards thermally induced randomization of orientation. This method is applicable to any particle shape, including spherical.

Figure 6:
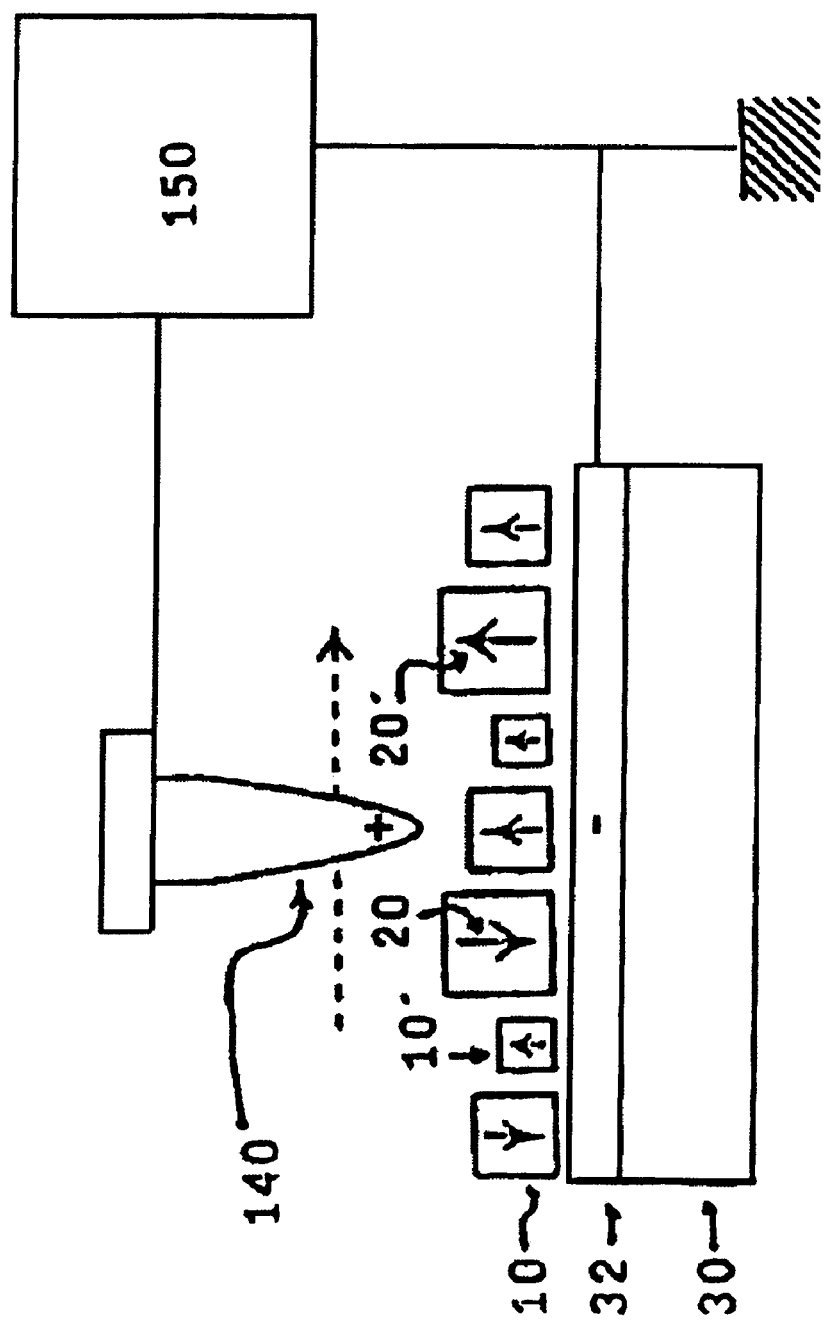
FIG. 6 illustrates a method for binary information storage in individual ferroelectric particles.

FIG. 6 illustrates a preferred method for binary information storage in individual ferroelectric particles. Each particle contains a single ferroelectric crystalline domain. The particles are adsorbed onto a conductive substrate and individually addressed with directing means 140, here a conductive tip of a scanning probe microscope (SPM) tip 140, attached to an electrical pulse generator 150. Negative or positive electrical pulses are applied to the particles via the SPM tip and polarize the particles in either the "up" or "down" direction, respectively, of their electrical dipoles 20, 20'. The figure illustrates a preferred method of writing binary information by applying electrical pulses to individual ferroelectric particles using a conductive SPM tip. A dashed arrow indicates the direction of movement of the tip. The particles exist as a monolayer or sub-monolayer on a conducting substrate, prepared by a method such as that described in FIG. 5. Each particle is addressable by movement of the SPM tip. The electrical field strength of the applied pulse is equal to or greater than the coercive field, $E_c$. The polarity of the applied electric field determines whether the resultant polarity of the permanent dipole in the particle is either up or down, representing either "0" or "1" in binary language.

It should be noted that the methods illustrated in FIGS. 4, 5, and 6 are exemplary only, and the present invention should not be limited to these particular examples. The present invention enables the construction and development of memory devices down to the 100 nm scale and below allowing for the further miniaturization of electronic components.

The fifteen following examples provide details for particle modification and deposition on the substrate, but the invention is by no means intended to be limited with respect to composition, form or method described.

Surface-modified Particles

EXAMPLE 1

$BaTiO_3$ powder (1 g) is suspended in toluene (20 ml) and N-(2-aminoethyl)-3-aminopropyltrimethoxysilane (AEAPS) (0.1 g) is added. The mixture is heated at 80–100° C. for 4 hours, then cooled to room temperature and centrifuged. After removing the supernatant liquid, the precipitate is washed twice by re-suspending it in toluene (10 ml) and centrifuging, washed once the same way with ethanol (10 ml), and then dried under vacuum at 80° C. The dried powder is suspended in aqueous 0.001 M HCl (20 ml) and treated ultrasonically until completely dispersed. If complete dispersion is not achieved, the non-dispersed material is removed by centrifugation.

EXAMPLE 2

A portion of the aqueous dispersion from Example 1 (10 ml) is mixed with bromoacetic acid (0.5 g) until the latter is dissolved. Then a 1 M solution of sodium carbonate in water (10 ml) is added. The resultant mixture is heated at 80–100° C. for 2 hours, then cooled to room temperature and centrifuged. After removing the supernatant liquid, the precipitate is washed twice by re-suspending it in water (5 ml) and centrifuging. The washed precipitate is re-suspended in water (10 ml) and treated ultrasonically until completely dispersed. If complete dispersion is not achieved, the non-dispersed material is removed by centrifugation.

EXAMPLE 3

$BaTiO_3$ powder (1 g) is suspended in iso-propanol (20 ml) and 5-sulfosalicylic acid (SSA) (0.1 g) is added. The mixture is heated at 70–80° C. for 2 hours, then cooled to room temperature and centrifuged. After removing the supernatant liquid, the precipitate is washed twice by re-suspending it in iso-propanol (10 ml) and centrifuging. It is then dried under vacuum at 80° C. The dried powder is suspended in aqueous 0.001 M NaOH (20 ml) and treated ultrasonically until completely dispersed. If complete dispersion is not achieved, the non-dispersed material is removed by centrifugation.

This is an example of "complexation" as referred to in claim 13. Here, the ligand is 5-sulfosalicyclic acid, which binds to titanium atoms on the surface of barium titanate particles. As indicated in the structure below, the de-protonated form of this molecule can bind to a titanium atom through its carboxylate and phenolate oxygen atoms so that the negatively charged sulfonate group is directed away from the surface of the particle.

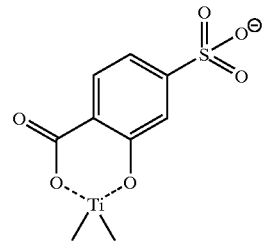

EXAMPLE 4

A 0.1 M solution of cupric chloride in water (10 ml) is stirred while the aqueous dispersion from Example 1 is slowly added until the color change from sky blue to dark blue is no longer observed.

EXAMPLE 5

A 0.1 M solution of cupric chloride in water (10 ml) is stirred while the aqueous dispersion from Example 2 is slowly added until the color change from sky blue to turquoise blue is no longer observed.

Examples 4 and 5 are supposed to illustrate claim 14. The charged moieties in these examples are copper (cupric, $Cu^{2+}$) ion complexes. The cupric ion tends to have fourco-ordinate (tetrahedral) coordination geometry. In Example 4, the four donor atoms may be the N-atoms present in two N-(2-aminoethyl)-3-aminopropyl groups. In Example 5, the four donor atoms may be the two N-atoms and two of the carboxylate O-atoms present after modification with bromoacetic acid (Example 2): The structures are indicated below.

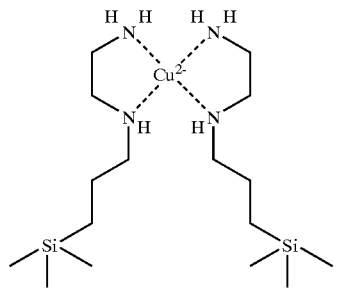

-continued

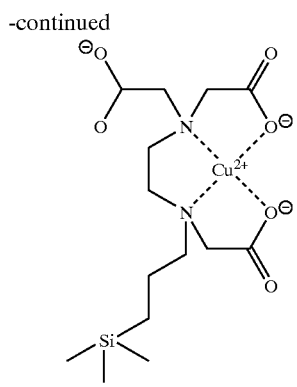

EXAMPLE 6

BaTiO$_3$ powder (1 g) is suspended in iso-propanol (20 ml) and poly(acrylic acid) (PAA) (0.1 g) is added. The mixture is heated at 70–80° C. for 2 hours, then cooled to room temperature and centrifuged. After removing the supernatant liquid, the precipitate is washed twice by re-suspending it in iso-propanol (10 ml) and centrifuging. It is then dried under vacuum at 80° C. The dried powder is suspended in aqueous 0.001 M NaOH (20 ml) and treated ultrasonically until completely dispersed. If complete dispersion is not achieved, the non-dispersed material is removed by centrifugation.

Surface Modified Substrates

EXAMPLE 7

A sheet of transparent electrically conducting glass with F-doped SnO$_2$ as conducting layer (F—SnO$_2$-glass (ca. 10 cm$^2$) is immersed into a solution of AEAPS (0.1 g) in toluene (20 ml). The solution is heated to 80–100° C. for 1 hour. After removing the substrate, it is washed with toluene and then with ethanol, then kept under vacuum at 80° C. for 2 hours.

EXAMPLE 8

A sheet of F—SnO$_2$-glass (ca. 10 cm$^2$) is immersed into a solution of (3-glycidoxypropyl)-trimethoxysilane (GPS) (0.1 g) in toluene (20 ml). The solution is heated to 80–100° C. for 1 hour. After removing the substrate, it is washed with toluene and then with ethanol, then kept under vacuum at 80° C. for 2 hours.

EXAMPLE 9

An evaporated film of carbon on glass (C-glass) (ca. 10 cm$^2$) is treated in a plasma cleaner with O$_2$ plasma until the surface of the film becomes hydrophilic (wetted by water).

Electrostatic Deposition of Particles

EXAMPLE 10

F—SnO$_2$-glass (ca. 10 cm$^2$) is placed into an aqueous dispersion of the AEAPS-treated particles from Example 1 (2 ml diluted with 20 ml water). The dispersion is stirred while aqueous 0.001 M NaOH solution is added gradually until the pH reaches ca. 7.5. The glass is removed after 1 hour and dried under vacuum at 80° C. for 2 hours.

EXAMPLE 11

AEAPS-treated F—SnO2-glass from Example 8 (ca. 10 cm$^2$) is placed into an aqueous dispersion of the SSA-treated particles from Example 3 (2 ml diluted with 20 ml water). The dispersion is stirred while aqueous 0.001 M HCl solution is added gradually until the pH reaches ca. 5. The glass is removed after 1 hour and dried under vacuum at 80° C. for 2 hours.

Electrophoretic Deposition of Particles

EXAMPLE 12

A portion of the aqueous dispersion of AEAPS-treated particles from Example 1 (2 ml) is diluted with water (20 ml) and placed in an open-circuit cell with co-planar ca. 10 cm$^2$ electrodes separated by a distance of 1 cm. F—SnO$_2$-glass is used as the cathode substrate and a C-glass is used as the anode. A conventional dc power supply is used to generate the applied voltage. The particles are deposited onto the F—SnO$_2$-glass by applying a voltage of 1 V. After deposition is complete (ca. 1 minute) the substrate is removed while the electrodes are still polarised. The polarisation is then switched off and the substrate is disconnected and dried under vacuum at 80° C. for 2 hours. Alternatively, aqueous 0.001 M NaOH is added to the dispersion gradually (with stirring) until the pH reaches ca. 7,5 before withdrawing the cathode.

EXAMPLE 13

The same procedure as in Example 12 is performed with the GPS-treated F—SnO$_2$-glass from Example 8 instead of untreated F—SnO$_2$-glass as the cathode substrate.

EXAMPLE 14

A portion of the aqueous dispersion of PAA-treated particles from Example 6 (2 ml) is diluted with water (20 ml) and placed in an open-circuit cell with co-planar ca. 10 cm$^2$ electrodes separated by a distance of 1 cm. C-glass is used as the anode substrate and F—SnO$_2$-glass is used as the cathode. The particles are deposited onto the C-glass by applying a dc voltage of 1 V. After deposition is complete (ca 1 minute) the substrate is removed while the electrodes are still polarised. The polarisation is then switched off and the substrate is disconnected and dried under vacuum at 80° C. for 2 hours.

EXAMPLE 15

The same procedure as in Example 14 is performed with the plasma-treated C-glass from Example 9 instead of untreated C-glass as the cathode substrate.

The features of the present invention disclosed in the specification, the claims and/or the drawings, may both separately and in any combination thereof, be material for realising the invention in various forms thereof.

What is claimed is:

1. A method of producing a ferroelectric memory which method comprises:

a) providing ferroelectric particles
   b) providing a substrate
   c) orientating at least a subset of said ferroelectric particles such that there is an axis of said particles along which axis a dipole moment may be directed in the ferroelectric state, said axis having an orientation the average of which is in at least one predetermined direction with regard to a surface of said substrate,
   d) after said orientating allowing said ferroelectric particles to attach to said substrate.

2. A method according to claim 1, wherein said at least one predetermined direction is essentially perpendicular to the surface of said substrate.

3. A method according to claim 1 wherein said at least one predetermined direction is at an oblique angle to the surface of said substrate.

4. A method according to claim 1 wherein said ferroelectric particles attach to said substrate in a manner that they are separated from each other on said substrate.

5. A method according to claim 1, wherein said ferroelectric particles attach to said substrate by electrostatic interactions.

6. A method according to claim 1, wherein said orientating occurs by electrostatic interactions.

7. A method according to claim 1, wherein said substrate exhibits charges of one electrical polarity, and wherein said ferroelectric particles exhibit charges of the opposite electrical polarity.

8. A method according to claim 7, wherein said charges exhibited by said substrate are generated by application of an electrical potential and optionally by adjusting a pH-value, and/or they are charged moieties appended to said substrate.

9. A method according to claim 8, wherein said charges exhibited by said ferroelectric particles are charged moieties appended to said particles.

10. A method according to claim 8, wherein said charged moieties are negative and comprise groups which can be represented by the general form $XO^-$ or $XS^-$, where X is covalently attached to $O^-$ or $S^-$ by one of its constituent atoms, said constituent atom being an atom selected from the second through sixteenth column and second through sixth row of the Periodic Table.

11. A method according to claim 8, wherein said charged moieties are positive and comprise groups which can be represented by the general form $C_4P^+$ or $C_3S^+$, where C is a carbon atom having $sp^3$ hybridisation, or by the general form $C_aNH_b^+$, where C is a carbon atom having either $sp^3$ or $sp^2$ hybridisation and the sum of the coefficients a and b equals 3 in the case of $sp^3$ hybridisation, or 2 in the case of $sp^2$ hybridisation.

12. A method according to claim 8, wherein said charged moieties are appended via silylation.

13. A method according to claim 8, wherein said charged moieties are appended via complexation.

14. A method according to claim 8, wherein said charged moieties are metal complexes.

15. A method according to claim 8, wherein said charged moieties are appended to a polymer.

16. A method according to claim 1 wherein said ferroelectric particles are single-domain particles.

17. A method according to claim 1, wherein said particles are 5–200 nm in size.

18. A method according to claim 1 wherein said ferroelectric particles are formed by compounds selected from the group consisting of mixed oxides containing corner sharing oxygen octahedra.

19. A method according to claim 1 wherein said ferroelectric particles are formed by compounds selected from the group consisting of perovskite-type compounds.

20. A method according to claim 1 wherein said ferroelectric particles are formed by compounds selected from the group consisting of tungsten-bronze type compounds.

21. A method according to claim 1 whrein said ferroelectric particles are formed by compounds selected from the group consisting of bismuth oxide layer-structured compounds.

22. A method according to claim 1 wherein said ferroelectric particles are formed by compounds selected from the group consisting of lithium niobate or lithium tantalate.

23. A method according to claim 1 wherein said ferroelectric particles are formed by compounds selected from the group which can be represented by the general form $A_lB_mO_n$, wherein A is selected from the group comprising $Li^+$, $Na^+$, $K^+$, $Ca^{2+}$, $Sr^{2+}$, $Ba^{2+}$, $La^{3+}$ (or other rare earth metal ion), $Co^{3+}$, $Cd^{2+}$, $Pb^{2+}$, and $Bi^{3+}$.

B is selected from the group comprising $Mg^{2+}$, $Ti^{4+}$, $Zr^{4+}$, $Hf^{4+}$, $Nb^{5+}$, $Ta^{5+}$, $W^{5+}$, $Mn^{3+}Fe^{3+}$, $Ni^{2+}$, $Zn^{2+}$, $Al^{3+}$, $Ga^{3+}$, $Sn^{4+}$, and $Sb^{5+}$, and l, m, and n are integral values such that the sum of positive valences contributed by the atoms in groups A and B equals 2 n.

24. A method according to claim 1, wherein said ferroelectric particles form a layer on said substrate.

25. A method according to claim 24, wherein said layer has a thickness in the range of 5–200 nm.

26. A method according to claim 24, wherein said layer is a monolayer.

27. A method according to claim 1, wherein said substrate forms part of an electrode, said electrode being at least partially immersed in a suspension of said particles.

28. A method according to claim 27, wherein said electrode forms part of an electrical cell, and electrical field being created in said electrical cell, said electrical field causing said substrate to exhibit charges of one polarity.

29. A method according to claim 27, wherein an adjustment of a pH-value of said suspension is used to cause said substrate to exhibit charges of one polarity.

30. A method method according to claim 27, wherein an adjustment of a pH-value of said suspension is used to cause said particles to exhibit charges of one polarity.

31. A method according to claim 29, wherein said pH-value of said suspension is adjusted to the range of 7–9.

32. A method according to claim 1, wherein, after attachment of said particles to said substrate, said particles are fixed to said substrate.

33. A method according to claim 32, wherein said particles are fixed to said substrate by means of drying and/or crosslinking and/or drying under vacuum.

34. A method according to claim 1, wherein said ferroelectric particles attach to said substrate by affinity interactions.

35. A method according to claim 1, wherein said ferroelectric particles attach to said substrate by covalent interactions.

36. A method of storing information on a substrate wherein, in a device obtainable by a method according to claim 1, a permanent dipole moment in the ferroelectric state is created in all or at least a plurality of said particles by directing means, resulting in groups of particles having essentially the same permanent dipole moment.

37. A method according to claim 36, wherein said dipole moment in the ferroelectric state is essentially perpendicular to a surface of said substrate.

38. A method according to claim 36, wherein said dipole moment in the ferroelectric state is at an Oblique angle to a surface of said substrate.

39. A method according to claim 36 wherein said directing means is selected from the group comprising probes of scanning probe microscopes.

40. A method according to claim 36, wherein said creating of said dipole moment occurs by applying electrical pulses to individual ferroelectric particles and/or by applying electrical pulses to groups of particles.

* * * * *